United States Patent [19]

Young

[11] 3,823,380

[45] July 9, 1974

[54] MICROWAVE DOWN CONVERTER EMPLOYING HALF WAVE OPEN CIRCUIT RESONATORS WITH OUTPUT TAKEN AT VOLTAGE NULL OF INPUT SIGNAL

[75] Inventor: George Young, Beverly, Mass.

[73] Assignee: Varian Associates, Palo Alto, Calif.

[22] Filed: Nov. 20, 1972

[21] Appl. No.: 308,225

[30] Foreign Application Priority Data

Sept. 7, 1971 Germany.......................... 2144638

[52] U.S. Cl................ 325/445, 325/446, 333/84 M

[51] Int. Cl............................................. H04b 1/26

[58] Field of Search........... 325/445, 446; 333/84 M

[56] References Cited

UNITED STATES PATENTS 3,350,649 10/1967 Blaeser............................. 325/445

*Primary Examiner*—Albert J. Mayer

*Attorney, Agent, or Firm*—Stanley Z. Cole; David Roy Pressman; R. K. Stoddard

[57] ABSTRACT

A pair of half wavelength open ended stripline resonators, resonant at a microwave input frequency and a microwave local oscillator frequency respectively, are excited with microwave input energy to be down converted and local oscillator energy, respectively. A mixer interconnects the two halfwave resonators to produce an intermediate frequency signal which is coupled onto said half wavelength resonators. The output intermediate frequency is extracted from one of the half wavelength resonators at a voltage null for the microwave excitation thereof, whereby the intermediate frequency energy is extracted without the requirement of an output microwave bypass capacitor. Thelocal oscillator microwave energy is obtained by multiplying a VHF local oscillator signal and exciting a half wavelength stripline resonator which in turn is coupled to the local oscillator half wavelength resonator.

9 Claims, 3 Drawing Figures

MICROWAVE DOWN CONVERTER EMPLOYING HALF WAVE OPEN CIRCUIT RESONATORS WITH OUTPUT TAKEN AT VOLTAGE NULL OF INPUT SIGNAL

BACKGROUND OF THE INVENTION

The present invention relates in general to microwave down converters and more particularly to an improved stripline down converter employing open circuited half wavelength stripline resonators, thereby avoiding the stringent requirements of providing microwave shorts between the opposed conductors defining the stripline resonators.

Heretofore, microwave stripline down converters have been proposed in which quarter wavelength microwave input and local oscillator stripline resonators were coupled together and to a mixer diode to derive a down converted intermediate frequency. The intermediate frequency signal, as of 200 MHz, was extracted from the mixer diode.

The problem with this type of a down converter, which utilized quarter wavelength stripline resonators, is that the stripline resonators must have good microwave shorts between the strip conductor and both of the opposed ground planes, in a balanced stripline circuit, as the quality of the electrical short and its position are critical to the tuning of the individual stripline resonators. Such microwave shorts are difficult to monitor during fabrication as they are hidden underneath the ground planes on opposite sides of the stripline circuit. Due to the difficulty of fabricating and controlling the quality of the microwave shorts, the manufacturing costs are inordinately high. Accordingly, it is desired to provide an improved stripline microwave down converter in which the resonators are more easily fabricated and inspected.

Another difficulty with the prior art stripline down converter, employing quarter wavelength stripline resonators, is that the intermediate frequency output line required a microwave bypass capacitor to prevent coupling of the microwave energy out of the circuit via the intermediate frequency output line. Such microwave bypass capacitors are relatively expensive and it is desired to minimize the number of such capacitors if possible.

SUMMARY OF THE PRESENT INVENTION

The principal object of the present invention is the provision of an improved microwave down converter.

In one feature of the present invention, the intermediate frequency output is extracted from a voltage null for microwave energy on a half wavelength microwave resonator open circuited at opposite ends, whereby output intermediate frequency energy is extracted from the microwave resonator without coupling of microwave energy onto the IF coupling means, thus eliminating the requirement for an output microwave bypass capacitor.

In another feature of the present invention, a pair of half wavelength stripline resonators, open circuited at their ends and each excited with a different microwave frequency, are coupled together by a mixer for developing on said half wavelength resonators an intermediate frequency signal.

In another feature of the present invention, the two conductors of a half wavelength stripline resonator are conductively connected together at a null point for the microwave energy thereon to ground the resonator for DC potential while not interferring with the microwave excitation of said resonator.

Other features and advantages of the present invention will become apparent upon a perusal of the following specification taken in connection with the accompanying drawings wherein:

DESCRIPTION OF THE PREFERRED EMBODIMENTS

Figure 1:
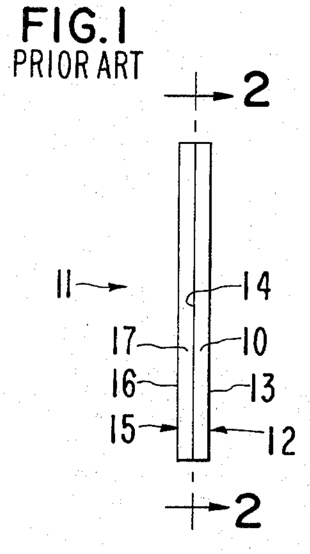
FIG.1 PRIOR ART
FIG. 1 is a side elevational view of a stripline microwave down converter of the prior art.
Figure 2:
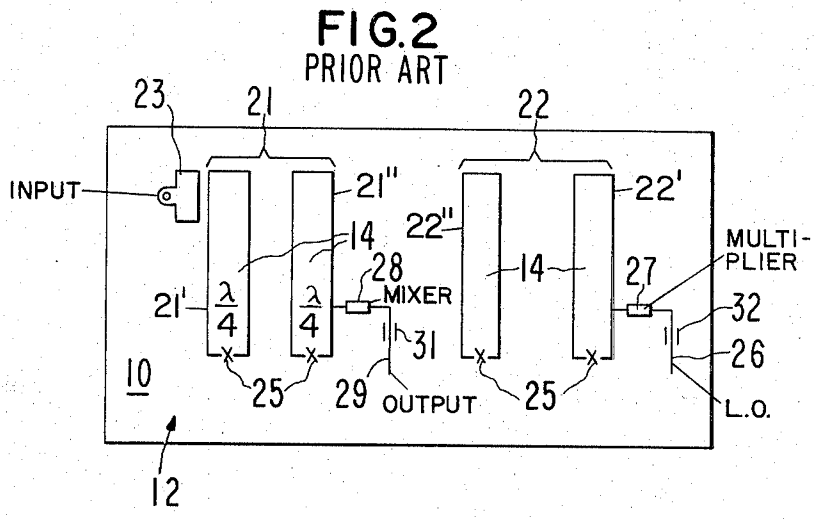
FIG.2 PRIOR ART
FIG. 2 is a sectional view of the structure of FIG. 1 taken along 2–2 in the direction of the arrows and showing the prior art stripline circuit in plan view.
Figure 3:
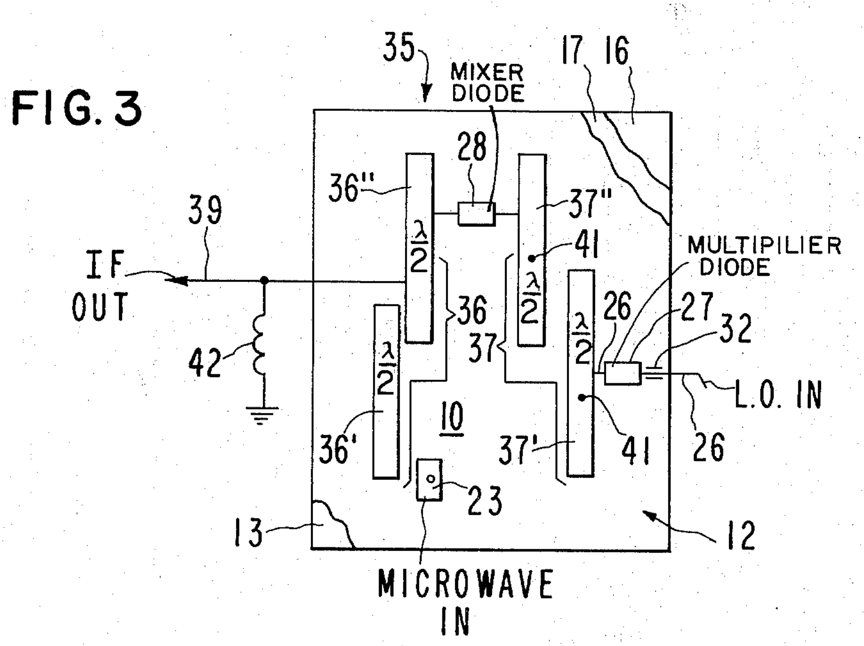
FIG. 3 is a view similar to that of FIG. 2 depicting a stripline microwave down converter incorporating features of the present invention.

Referring now to FIGS. 1 and 2, there is shown a prior art microwave stripline down converter 11. The stripline circuit 11 includes a printed circuit board 12 forming one half of the composite stripline circuit 11. Circuit board 12 includes a copper sheet 13 extending over the right-hand (FIG. 1) face of the circuit board 12. A plurality of strip conductors 14 are formed, as by conventional printed circuit techniques, on the left-hand face of the board 12. The board itself comprises a dielectric plate or substrate 10, as of one-sixteenth inch in thickness. The second half of the printed stripline circuit 11 includes a second circuit board 15 having a copper sheet 16 formed on the left-hand face of a dielectric substrate plate 17 as of one-sixteenth inch thick. No printed circuitry is provided on the right-hand face of circuit board 15. The two outer conductive sheets 13 and 16 form the microwave ground plane members for a balanced stripline circuit defined by the spaces between the stripline conductors 14 and the mutually opposed ground plane members 13 and 16, respectively.

Referring now to FIG. 2, the stripline microwave down converter circuit 11 is shown in greater detail. The circuit 11 includes two pairs of quarter stripline resonators 21 and 22, respectively. Input microwave signal wave energy to be converted down in frequency is supplied to a first one of the quarter wave resonators 21′ via an input stripline section 23. Microwave energy for excitation of the input stripline 23 is brought through an aperture in ground plane member 13 and the intervening dielectric substrate 10 via a lead, not shown. Input microwave line 23 is axially coextensive with a portion of the first quarter wave resonator 21′ for excitation of the first quarter wave resonator. The first quarter wave resonator 21′ is closely spaced to the second quarter wave resonator 21″ for excitation thereof. Each of the quarter wave resonators 21 includes electrically conductive strips at 25 connecting the center conductive strip 14 to both of the opposed ground plane members 15 and 16, respectively, to provide a microwave electrical short at one end of each of the quarter wave resonators.

square feed-through capacitor such as that manufactured by Centralab and identified as their model CPNP0050BC101K (a 100 picofarad Ceramolithic chip capacitor).

The advantage of the microwave stripline down converter 35 employing the half wavelength resonators is that the sensitive frequency determining elements of the respective resonators 36 and 37 may be formed by printed circuit techniques without reliance upon formation of good microwave conductive shorts at the ends of the resonators. In addition, the output microwave bypass capacitor for the output IF line has been eliminated by coupling the IF output from a voltage null on the output microwave resonator 36''. The microwave down converter circuitry of the present invention is useful in general through the entire microwave frequency range and particularly in the frequency range between 1,500 MHz and X-band.

What is claimed is:

1. In a microwave circuit:

a length of transmission line open circuited for microwave energy at both ends for defining a half wave resonator for microwave energy of a first frequency $f_1$;

means for exciting said half wave resonator with microwave energy of said first microwave frequency $f_1$;

means for deriving from said microwave energy of said first microwave frequency $f_1$ on said half wave resonator, wave energy of an intermediate frequency IF at a substantially lower frequency than said microwave frequency $f_1$, and for exciting said half wave resonator with said intermediate frequency IF; and output coupling means for coupling energy of said intermediate frequency IF from said half wave resonator at a substantial voltage null on said resonator for microwave energy of said microwave frequency $f_1$ to avoid substantial coupling of said microwave energy of frequency $f_1$ from said half wave resonator via said output coupling means.

2. The apparatus of claim 1 wherein said half wave resonator comprises a strip of electrically conductive material overlaying an electrically conductive sheet means in spaced relation therefrom.

3. The apparatus of claim 2 wherein the microwave circuit is a microwave down converter and includes:

a second length of transmission line open circuited for microwave energy at both ends for defining a second half wave resonator for microwave energy of a second microwave frequency $f_2$, said second half wave resonator comprising a second strip of electrically conductive material overlaying an electrically conductive sheet means in spaced relation therefrom;

means for exciting said second half wave resonator with microwave energy of a second microwave frequency $f_2$;

and wherein said means for exciting said first half wave resonator with said intermediate frequency energy includes mixer means connected intermediate said first and second strip conductors of said first and second half wave resonators for mixing the two microwave frequency energies to derive said intermediate frequency energy and for exciting said first half wave resonator with said intermediate frequency energy.

4. The apparatus of claim 3 including means connected substantially at a voltage null on said second half wave resonator for the microwave energy thereon of said second microwave frequency $f_2$ for interconnecting said second conductive strip and said conductive sheet means to provide a DC return path for said mixer means.

5. The apparatus of claim 4 including means connected substantially at a voltage null on said first half wave resonator for the microwave energy thereon of said first microwave frequency $f_1$ for interconnecting said first conductive strip and said conductive sheet means to provide a second DC return path for said mixer means.

6. The apparatus of claim 3 wherein said means for exciting said second half wave resonator with microwave energy of said second microwave frequency $f_2$ includes, a third length of transmission line open circuited for microwave energy at both ends for defining a third half wave resonator for microwave energy of said second microwave frequency $f_2$, said third resonator being coupled to said second half wave resonator in microwave energy exchanging relation therewith, said third half wave resonator including a third strip of electrically conductive material overlaying an electrically conductive sheet means in spaced relation therefrom; and means for exciting said third half wave resonator with microwave energy of said second microwave frequency $f_2$.

7. The apparatus of claim 6 wherein said means exciting said third half wave resonator with energy of said second microwave frequency $f_2$ includes, multiplier means connected intermediate said third conductive strip and a source of local oscillator signal energy at a local oscillator frequency which is a sub-multiple of said second microwave frequency $f_2$ for multiplying the frequency of said local oscillator energy up to said second microwave frequency $f_2$.

8. The apparatus of claim 7 including means connected substantially at a voltage null on said third half wave resonator for the microwave energy thereon of said second microwave frequency for interconnecting said third conductive strip and said conductive sheet means to provide a DC return path for said multiplier means.

9. The apparatus of claim 3 wherein said means for exciting said first half wave resonator means at said first microwave frequency $f_1$ includes a fourth length of transmission line open circuited for microwave energy at both ends for defining a fourth half wave resonator for microwave energy of said first microwave frequency $f_1$, said fourth resonator being coupled to said first half wave resonator in microwave energy exchanging relation therewith, said fourth half wave resonator including a fourth strip of electrically conductive material overlaying an electrically conductive sheet means in spaced relation therefrom.

* * * * *